(12) United States Patent
Choi et al.

(10) Patent No.: US 10,996,462 B2
(45) Date of Patent: *May 4, 2021

(54) CAMERA MODULE

(71) Applicant: LG INNOTEK CO., LTD., Seoul (KR)

(72) Inventors: Hyun Ho Choi, Seoul (KR); Kang Yeol Park, Seoul (KR); Sang Jun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/843,128

(22) Filed: Apr. 8, 2020

(65) Prior Publication Data
US 2020/0233209 A1    Jul. 23, 2020

Related U.S. Application Data

(63) Continuation of application No. 16/322,325, filed as application No. PCT/KR2017/007284 on Jul. 7, 2017, now Pat. No. 10,649,205.

(30) Foreign Application Priority Data

Aug. 11, 2016 (KR) .......................... 10-2016-0102398

(51) Int. Cl.
G02B 27/00 (2006.01)
G03B 11/00 (2021.01)
H04N 5/225 (2006.01)
C03C 17/34 (2006.01)
H01L 27/146 (2006.01)
(Continued)

(52) U.S. Cl.
CPC ............ *G02B 27/0006* (2013.01); *B32B 7/02* (2013.01); *C03C 17/32* (2013.01); *C03C 17/34* (2013.01);
(Continued)

(58) Field of Classification Search
USPC ......................................................... 348/143
See application file for complete search history.

(56) References Cited

U.S. PATENT DOCUMENTS 6,215,597 B1 *   4/2001   Duncan .................... G02B 5/04
                                                      359/634
9,176,298 B1    11/2015   Gustafson et al.
(Continued)

FOREIGN PATENT DOCUMENTS

CN    1497634 A    5/2004
CN    1673791 A    9/2005
(Continued)

OTHER PUBLICATIONS

Office Action dated Apr. 29, 2020 in Chinese Application No. 201780049711.X.
(Continued)

*Primary Examiner* — Behrooz M Senfi
(74) *Attorney, Agent, or Firm* — Saliwanchik, Lloyd & Eisenschenk

(57) ABSTRACT

A camera module according to one embodiment comprises: a barrel provided with at least one lens; a retainer having an inner space and accommodating the barrel in the inner space; a holder coupled to the lower portion of the retainer; a housing disposed on the lower side of the holder and accommodating a printed circuit board; and a cover part mounted on the retainer and disposed in front of the lens. The cover part comprises: a cover glass; a first reflection suppression layer disposed on the upper side of the cover glass; a heating layer disposed on the lower side of the glass cover; and a second reflection suppression layer disposed on the lower side of the heating layer.

20 Claims, 7 Drawing Sheets

(51) Int. Cl.
*G02B 21/36* (2006.01)
*B32B 7/02* (2019.01)
*C03C 17/32* (2006.01)
*G02B 1/11* (2015.01)
*H01R 12/62* (2011.01)

(52) U.S. Cl.
CPC ............... *G02B 1/11* (2013.01); *G02B 21/36* (2013.01); *G03B 11/00* (2013.01); *H01L 27/146* (2013.01); *H04N 5/2252* (2013.01); *H04N 5/2253* (2013.01); *H04N 5/2254* (2013.01); *H04N 5/2257* (2013.01); *C03C 2217/73* (2013.01); *C03C 2217/75* (2013.01); *C03C 2217/76* (2013.01); *C03C 2217/94* (2013.01); *C03C 2217/948* (2013.01); *C03C 2218/365* (2013.01); *H01R 12/62* (2013.01)

(56) References Cited

U.S. PATENT DOCUMENTS

| | | | | |
|---|---|---|---|---|
| 10,649,205 | B2 * | 5/2020 | Choi | .................... G03B 17/55 |
| 2009/0115891 | A1 | 5/2009 | Ryu et al. | |
| 2011/0244224 | A1 | 10/2011 | Kurihara | |
| 2011/0249120 | A1 | 10/2011 | Bingle et al. | |
| 2012/0019940 | A1 | 1/2012 | Lu et al. | |
| 2014/0044869 | A1 | 2/2014 | Phang | |
| 2015/0160536 | A1 * | 6/2015 | Lang | .................... H04N 5/2254 |
| | | | | 348/374 |
| 2016/0100082 | A1 | 4/2016 | Schack et al. | |
| 2019/0291658 | A1 | 9/2019 | Bingle et al. | |
| 2019/0302576 | A1 * | 10/2019 | Rafalowski | ............ G02B 7/028 |

FOREIGN PATENT DOCUMENTS

| | | |
|---|---|---|
| CN | 1815287 A | 8/2006 |
| CN | 1940621 A | 4/2007 |
| CN | 105572770 A | 5/2016 |
| KR | 10-2011-0068442 A | 6/2011 |
| WO | WO-2010/111465 A1 | 9/2010 |
| WO | WO-2015/185431 A1 | 12/2015 |

OTHER PUBLICATIONS

International Search Report in International Application No. PCT/KR2017/007284, dated Jul. 7, 2017.
Notice of Allowance dated Jan. 8, 2020 in U.S. Appl. No. 16/322,325.

* cited by examiner

CAMERA MODULE

CROSS-REFERENCE TO RELATED APPLICATIONS

This application is a continuation of U.S. application Ser. No. 16/322,325, filed Jan. 31, 2019; which is the U.S. national stage application of International Patent Application No. PCT/KR2017/007284, filed Jul. 7, 2017, which claims the benefit under 35 U.S.C. § 119 of Korean Application No. 10-2016-0102398, filed Aug. 11, 2016, the disclosures of each of which are incorporated herein by reference in their entirety.

TECHNICAL FIELD

Embodiments relate to a camera module having a structure capable of effectively coping with the formation of dew or frost caused by the external environment.

BACKGROUND ART

The content described in this section merely provides background information regarding embodiments, and does not constitute the prior art.

Camera modules may be used for various purposes. For example, camera modules may be used as CCTVs for security, black boxes for vehicles, rear-view cameras used for parking vehicles, and the like.

Camera modules for use in security systems or vehicles may be located outdoors. Thus, at least some of the parts of camera modules may be exposed to the outdoor environment.

In particular, dew or frost may be formed on a portion of the camera module, on which light is incident, according to the surrounding environment. The formation of dew or frost may block the incidence of light on a lens, which may lead to defective operation of the camera module or may obscure or distort a captured image.

Therefore, there is a need for the development of a camera module capable of effectively coping with the formation of dew or frost.

DISCLOSURE

Technical Problem

Therefore, embodiments relate to a camera module having a structure capable of effectively coping with the formation of dew or frost caused by the external environment.

However, the objects to be accomplished by the embodiments are not limited to the above-mentioned objects, and other objects not mentioned will be clearly understood by those skilled in the art to which the embodiments pertain from the following description.

Technical Solution

A camera module according to one embodiment may include a barrel including at least one lens disposed therein, a retainer having therein an internal space accommodating the barrel therein, a holder coupled to a lower portion of the retainer, a housing disposed under the holder, the housing accommodating a printed circuit board therein, and a cover part mounted to the retainer, the cover part being disposed in front of the lens, wherein the cover part may include a cover glass, a first reflection prevention layer disposed on the cover glass, a heating layer disposed under the cover glass, and a second reflection prevention layer disposed under the heating layer.

The heating layer may be made from an indium-tin oxide material.

The cover part may further include an electrode layer disposed under the heating layer and on a side surface of the second reflection prevention layer, and a connector electrically connected at one end thereof to the electrode layer.

The retainer may include a protruding portion protruding from the inner circumferential surface thereof, the protruding portion being configured to support the cover part, and at least a portion of the connector may be disposed between the cover part and the protruding portion.

The connector may include a bonding portion configured to be bonded to the cover part, the bonding portion being disposed between the cover part and the protruding portion, and a connecting portion electrically connected at one end thereof to the bonding portion and electrically connected at the opposite end thereof to the printed circuit board, and the holder may include a through-hole formed therein to allow the connecting portion to be located therein to connect the connector to the printed circuit board.

The electrode layer may be formed in a ring shape when viewed in an optical-axis direction and may be made from an anisotropic conductive film (ACF) material.

The electrode layer may be formed in a circular arc shape or a straight line shape when viewed in the optical-axis direction and may be provided in a pair.

The cover part may further include a coating layer, which is disposed on the first reflection prevention layer and is coated with an ultra-hydrophilic material or a hydrophobic material.

The cover part may further include a print layer disposed between the cover glass and the first reflection prevention layer. The print layer may be formed in a ring shape along the periphery of the first reflection prevention layer and may be made from an opaque material.

A camera module according to another embodiment may include a barrel including at least one lens disposed therein, a retainer having therein an internal space accommodating the barrel, a holder coupled to a lower portion of the retainer, a housing disposed under the holder, the housing accommodating a printed circuit board, and a cover part mounted to the retainer, the cover part being disposed in front of the lens, wherein the cover part may include a cover glass, a first reflection prevention layer disposed on the cover glass, a heating layer disposed under the cover glass, a second reflection prevention layer disposed under the heating layer, an electrode layer disposed under the heating layer and on a side surface of the second reflection prevention layer, an ultra-hydrophilic or hydrophobic coating layer disposed on the first reflection prevention layer, and a print layer disposed between the cover glass and the first reflection prevention layer, the print layer being formed in a ring shape along the periphery of the first reflection prevention layer and being made from an opaque material.

Advantageous Effects

In the camera module according to the embodiment, the cover part is heated by a simple structure using the heating layer, thus making it possible to inhibit the formation of dew or frost or to promptly remove dew or frost that has already formed.

In the embodiment, in the case in which the electrode layer is formed in a ring shape using an anisotropic conductive film material, two leads of the connector may be connected to the electrode layer without considering the polarity of the electrode layer, thus making it possible to simplify the process.

In the embodiment, the print layer may inhibit external incident light from directly reaching the electrode layer and being reflected therefrom, thereby inhibiting the quality of an image captured by the image sensor from being deteriorated by the optical reflection from the electrode layer.

DESCRIPTION OF DRAWINGS

FIGS. 6 to 8 illustrate the state in which the electrode layer is coupled to the cover part when viewed from the lower side of the camera module to the upper side thereof in an optical-axis direction.

BEST MODE

Figure 1:
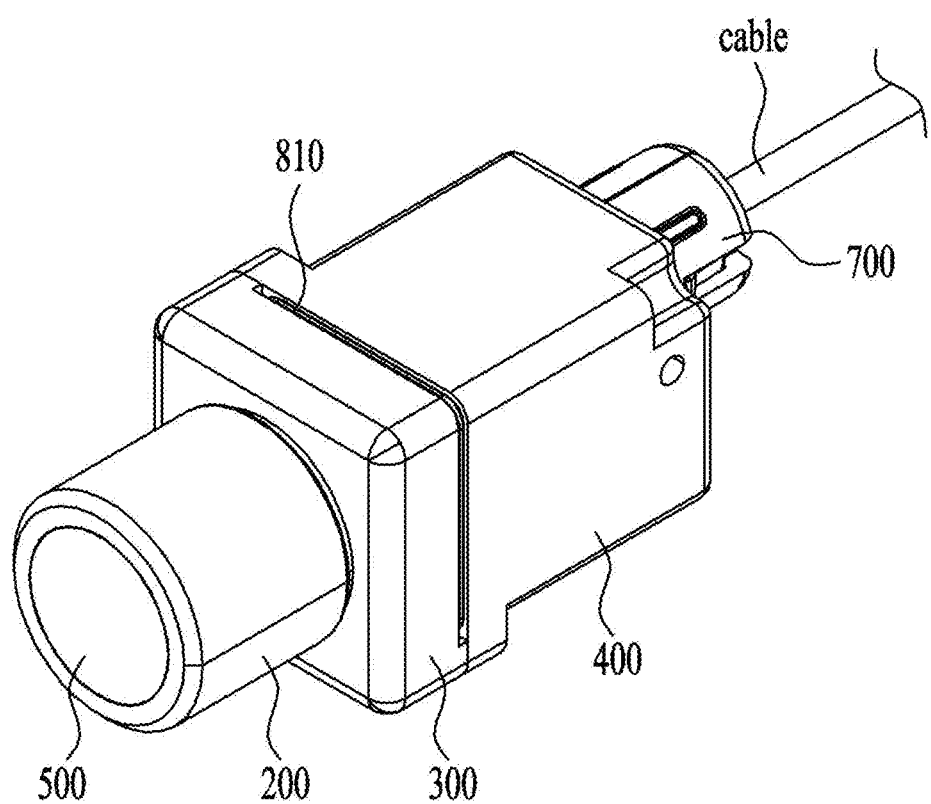
FIG. 1 is a perspective view illustrating a camera module according to one embodiment.

Hereinafter, embodiments will be described in detail with reference to the accompanying drawings. While the disclosure is subject to various modifications and alternative forms, specific embodiments thereof are shown by way of example in the drawings and are explained in detail in the description. However, the disclosure should not be construed as being limited to the embodiments set forth herein, but on the contrary, the disclosure is intended to cover all modifications, equivalents, and alternatives falling within the spirit and scope of the embodiments.

It may be understood that, although the terms "first," "second," etc. may be used herein to describe various elements, these elements are not to be construed as being limited by these terms. These terms are generally only used to distinguish one element from another. In addition, terms particularly defined in consideration of the construction and operation of the embodiments are used only to describe the embodiments, but do not define the scope of the embodiments.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject or element, without necessarily requiring or involving any physical or logical relationship or sequence between the subjects or elements.

In addition, a Cartesian coordinate system (x, y, z) may be used in the drawings. In the drawings, the x-axis and the y-axis are axes perpendicular to an optical axis. For convenience, the optical-axis direction (z-axis direction) may be referred to as a "first direction," the x-axis direction may be referred to as a "second direction," and the y-axis direction may be referred to as a "third direction".

Figure 2:
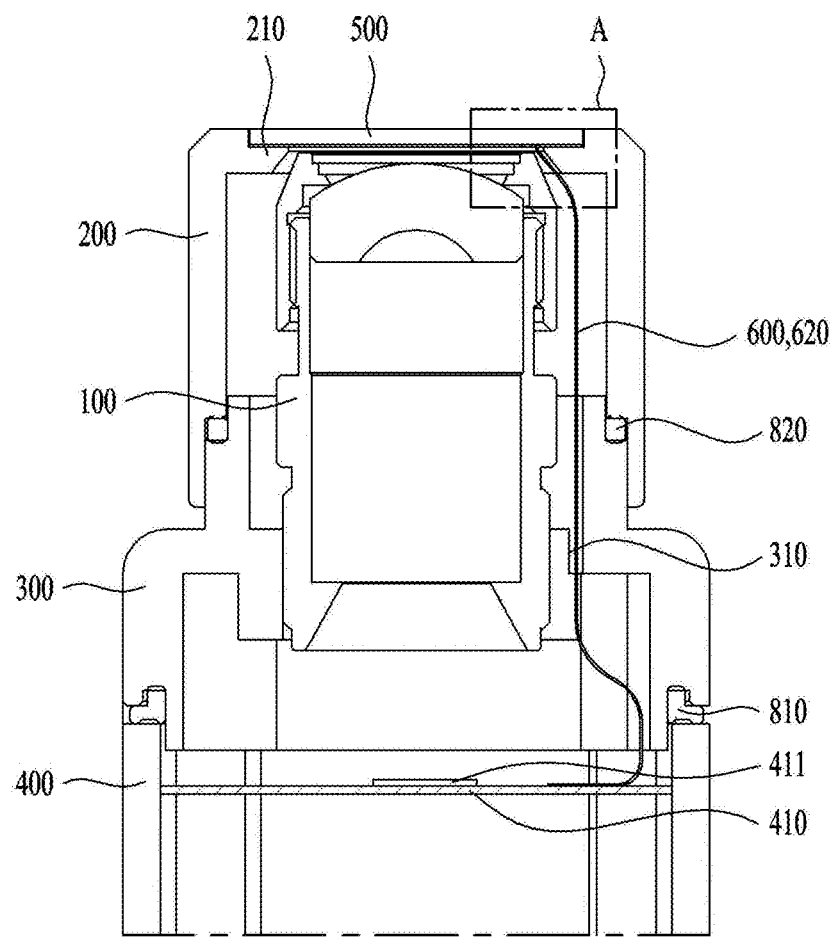
FIG. 2 is a cross-sectional view illustrating the camera module according to the embodiment.

FIG. 1 is a perspective view illustrating a camera module according to one embodiment. FIG. 2 is a cross-sectional view illustrating the camera module according to the embodiment.

The camera module according to the embodiment may include a barrel 100, a retainer 200, a holder 300, a housing 400, a cover part 500, a connector 600, a support part 700, a first sealing member 810, and a second sealing member 820.

At least one lens may be disposed at the barrel 100. That is, the barrel 100 may have therein a hollow region, and at least one lens, which is arranged in the optical-axis direction, may be provided inside the barrel 100 or on the upper side of the barrel 100.

The lens disposed at the barrel 100 may be configured as a single lens, or a plurality of lenses may be configured to form an optical system. As one embodiment, FIG. 2 illustrates a structure in which a plurality of lenses is aligned in the optical-axis direction in the barrel 100 to form an optical system.

The retainer 200 may accommodate the barrel 100. To this end, an internal space may be formed in the retainer 200, and a portion of the barrel 100 may be accommodated in the internal space. The barrel 100 may be coupled to the retainer 200 in a manner of screw coupling or adhesive bonding.

For example, in the case of screw coupling, male threads may be formed in at least a portion of the outer circumferential surface of the barrel 100, and corresponding female threads may be formed in the inner circumferential surface of the retainer 200 so that the barrel 100 and the retainer 200 are screwed to each other.

Similar to the barrel 100, the retainer 200 may have therein a hollow region. When the barrel 100 and the retainer 200 are coupled to each other, the hollow region in the barrel 100 and the hollow region in the retainer 200 may be arranged to face each other and communicate with each other in the optical-axis direction, and light may pass through the barrel 100 in the optical-axis direction through the lens mounted across the hollow region in the barrel 100 and the hollow region in the retainer 200.

Further, the retainer 200 may be in contact with the lens disposed at the top portion of the barrel 100 and may inhibit the barrel 100 and the lens from moving in the optical-axis direction, i.e. in the upward-and-downward direction in FIG. 2.

The holder 300 may be coupled to the lower portion of the retainer 200. The holder 300 and the retainer 200 may be coupled to each other in a manner of screw coupling or adhesive bonding. In the case of screw coupling, the holder 300 and the retainer 200 may be coupled in the manner similar to the coupling of the barrel 100 and the retainer 200, which was described above.

The holder 300 may have therein a hollow region, into which the lower portion of the lens barrel 100 may be inserted.

Meanwhile, a gap may be formed in the coupling portion between the retainer 200 and the holder 300, and external foreign substances may be introduced into the camera module through the gap. Therefore, as illustrated in FIG. 2, the second sealing member 820 may be provided in the coupling portion between the retainer 200 and the holder 300 and may inhibit foreign substances from being introduced into the camera module.

The housing 400 may be disposed under the holder 300 and may be coupled to the holder 300. The housing 400 and the holder 300 may be coupled to each other using a fastening member, for example, a bolt, a screw, etc.

The housing 400 may have a through-hole formed in the edge thereof, into which the fastening member is inserted, and the holder 300 may have a recess formed in a portion thereof that corresponds to the through-hole. The housing 400 and the holder 300 may be coupled to each other by insertion and fastening of the fastening member into the through-hole and the recess.

As shown in FIG. 2, the housing 400 may have an avoidance portion, which is formed near the portion in which the through-hole is formed, in order to provide a space for fastening of the fastening member.

Meanwhile, a gap may be formed in the coupling portion between the holder 300 and the housing 400, and external foreign substances may be introduced into the camera module through the gap. Therefore, as illustrated in FIG. 2, the first sealing member 810 may be provided in the coupling portion between the holder 300 and the housing 400, and may inhibit foreign substances from being introduced into the camera module.

A printed circuit board 410 may be provided in the housing 400. An image sensor 411 may be mounted on the surface of the printed circuit board 410 that faces the lens, so that light incident on the lens reaches the image sensor 411.

In addition, the printed circuit board 410 may be electrically connected with a cable to receive power, necessary for the operation of the camera module, from the outside. An illustration of the connection structure between the printed circuit board 410 and the cable has been omitted for clarity.

It is illustrated, as one embodiment, in FIG. 2 that a single printed circuit board 410 is provided. However, as another embodiment, two or more printed circuit boards 410 may be provided. The printed circuit boards 410 may be arranged so as to be spaced apart from each other in the optical-axis direction. The retainer 200 may receive power from the printed circuit board 410 and may be heated, which will be described in detail later.

In the case in which a plurality of printed circuit boards 410 is provided, the image sensor 411 may be mounted on a surface of one of the printed circuit boards 410 that is located at a position facing the lens, and the surface of the printed circuit board 410 on which the image sensor 411 is mounted may face the lens.

In addition, the printed circuit board 410 may be provided with various elements and circuits for processing image information obtained from the image sensor 411.

The cover part 500 may be mounted on the retainer 200 and may be disposed in front of the lens. In order to mount the cover part 500 on the retainer 200, as illustrated in FIG. 2, an indented portion for receiving the cover part 500 may be formed in the top portion of the retainer 200. The cover part 500 may be mounted in the indented portion in the retainer 200.

In order to inhibit external foreign substances from being introduced into a gap, which may be formed in the coupling portion between the cover part 500 and the retainer 200, the cover part 500 may be attached to the retainer 200 using, for example, an adhesive. A detailed description of the cover part 500 will be made later with reference to FIG. 3.

The connector 600 may be connected at one end thereof to the cover part 500 and may be connected at the opposite end thereof to the printed circuit board 410. Thus, the connector 600 may serve as a passage for the supply of power from the printed circuit board 410 to the cover part 500. A detailed description of the connector 600 will be made later with reference to the drawings.

The support part 700 may be disposed under the housing 400 and may serve to support the cable that is electrically connected with the camera module. The support part 700 may securely support the cable to inhibit the cable from being electrically disconnected from the camera module or the printed circuit board 410 by shocks applied to the cable.

Figure 3:
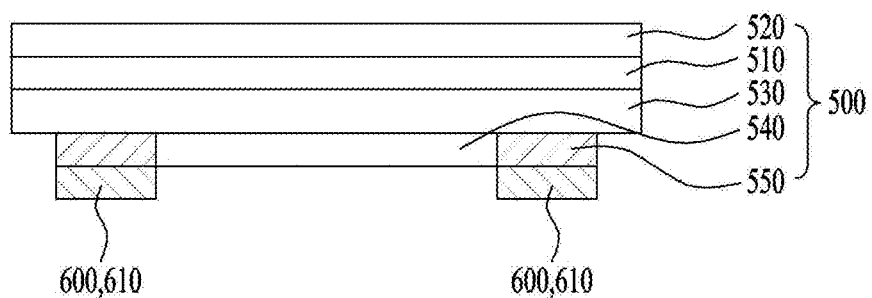
FIG. 3 is a view illustrating the structure of a cover part and the connection structure between the cover part and a connector according to one embodiment.

FIG. 3 is a view illustrating the structure of the cover part 500 and the connection structure between the cover part 500 and the connector 600 according to one embodiment. The cover part 500 may be mounted on the retainer 200 and may block the hollow region formed in the retainer 200. Thus, the cover part 500 may be disposed in front of the lens.

Thus, the cover part 500 may serve to protect the lens, which is provided at the barrel 100 accommodated in the hollow region, from being exposed outside and to inhibit foreign substances from being introduced into the hollow region from the outside.

As illustrated in FIG. 3, the cover part 500 may include a cover glass 510, a first reflection prevention layer 520, a heating layer 530, a second reflection prevention layer 540, and an electrode layer 550. In order to allow light to be incident on the lens via the cover part 500, the cover glass 510, the first reflection prevention layer 520, the heating layer 530 and the second reflection prevention layer 540 may be made from a transparent material, and may be formed in a circular shape when viewed in the optical-axis direction.

The cover glass 510 may serve to protect the lens disposed in the hollow region in the retainer 200 by blocking the hollow region in the retainer 200. In order to improve the function of the cover glass 510, the respective layers, which will be described below, will be provided on or under the cover glass 510.

The first reflection prevention layer 520 may be disposed on the cover glass 510 and may serve to inhibit reflection of light, incident on the cover glass 510, from the top surface of the cover glass 510 or to reduce the reflectivity thereof.

The first reflection prevention layer 520 may improve the quality of an image captured by the camera module by reducing the optical reflectivity of the surface of the cover glass 510.

The heating layer 530 may be disposed under the cover glass 510 and may heat the cover part 500. The purpose of heating the cover part 500 using the heating layer 530 is to effectively cope with the formation of dew or frost on the cover part 500.

Because the front face of the cover glass 510, as illustrated in FIGS. 1 and 2, is exposed outside, the cover glass 510 may be affected by the surrounding environment. In particular, while the camera module operates, the interior of the camera module may be heated, but the exterior of the camera module may be in a cold environment. In this case, dew may form on the cover glass 510 due to the temperature difference between the region inside the cover glass 510 and the region outside the cover glass 510.

In addition, in the case in which the temperature outside the camera module is equal to or less than a freezing point, frost may form on the external exposed portion of the cover glass 510.

The formation of dew or frost may make the lens opaque or may greatly reduce the transparency of the lens, and may thus block the incidence of light on the lens, which may lead to defective operation of the camera module or may obscure or distort a captured image.

Therefore, in the embodiment, the cover glass 510 needs to be heated in order to inhibit the formation of dew or frost on the cover glass 510 or to promptly remove dew or frost that has already formed. To this end, the cover glass 510 may be heated by the heating layer 530.

The heating layer 530 may be configured to receive power and to be heated in the manner of, for example, electrical resistance heating. To this end, the heating layer 530 may be made from a conductive material.

In addition, because the heating layer 530 is included in the cover part 500, it is desirable for the heating layer 530 to be made from a transparent material to allow light transmission. Thus, it is desirable for the heating layer 530 to be made from a transparent conductive material.

It is desirable for the heating layer 530 to be made from, for example, indium-tin oxide. This is because indium-tin oxide is transparent and conductive.

The heating layer 530 may receive power from the printed circuit board 410 and may be heated in the manner of, for example, electrical resistance heating. The heating layer 530 may be electrically connected to the printed circuit board 410 via the electrode layer 550 and the connector 600.

The second reflection prevention layer 540 may be disposed under the heating layer 530 and may serve to inhibit the reflection of light, incident on the cover glass 510, from the bottom surface of the cover glass 510 or to reduce the reflectivity thereof.

Like the first reflection prevention layer 520, the second reflection prevention layer 540 may improve the quality of an image captured by the camera module by reducing the optical reflectivity of the surface of the cover glass 510.

The electrode layer 550 may be disposed under the heating layer 530 and on the side surface of the second reflection prevention layer 540. The electrode layer 550 may serve to electrically connect the heating layer 530 and the connector 600.

The electrode layer 550 may be made from, for example, an anisotropic conductive film (ACF) material, an isotropic conductive film (ICF) material, a conductive resin material, or the like. In another embodiment, the electrode layer 550 may be made from any one of film-type conductive materials other than the above-mentioned materials. The detailed configuration of the electrode layer 550 will be described later with reference to FIGS. 6 to 8.

Figure 4A:
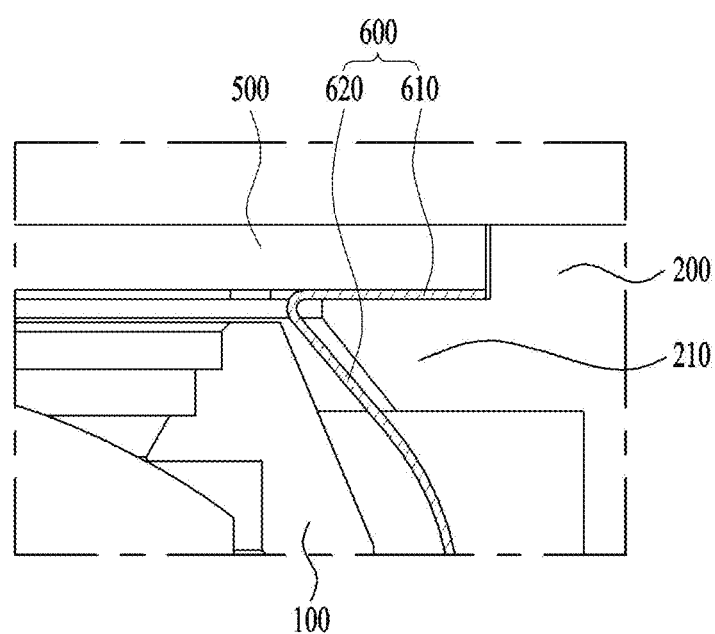
FIG. 4a is an enlarged view of portion A in FIG. 2.
Figure 4B:
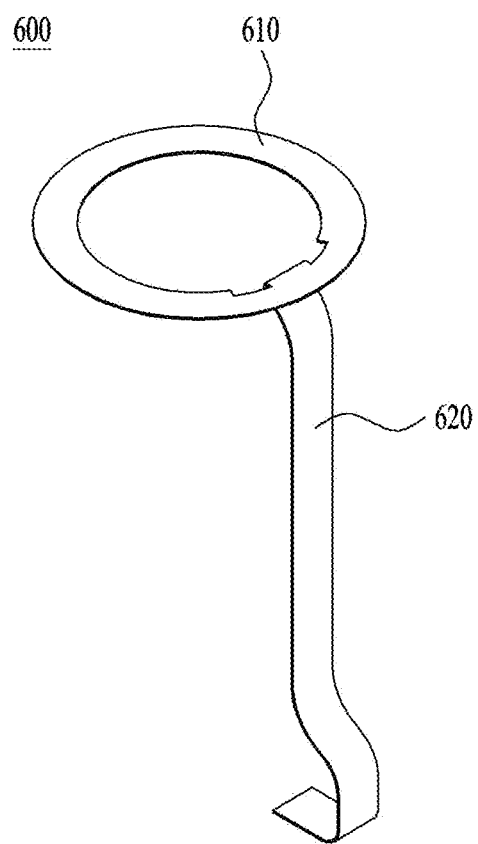
FIG. 4b is a perspective view illustrating a connector according to one embodiment.
Figure 5:
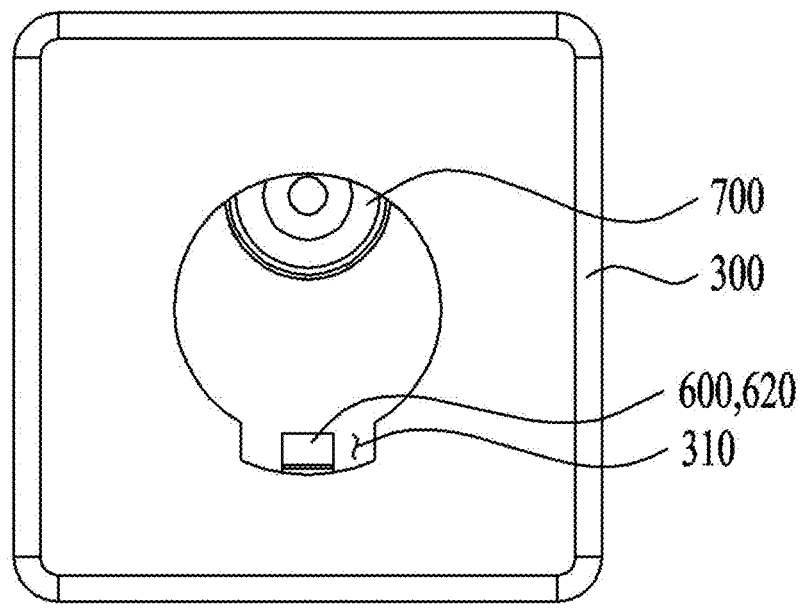
FIG. 5 is a front-sectional view of a holder according to one embodiment.

FIG. 4a is an enlarged view of portion A in FIG. 2. FIG. 4b is a perspective view illustrating the connector 600 according to one embodiment. FIG. 5 is a front-sectional view of the holder 300 according to one embodiment.

The connector 600 may be electrically connected at one end thereof to the electrode layer 550 and may be electrically connected at the opposite end thereof to the printed circuit board 410. The connector 600, as illustrated in FIG. 4b, may include a bonding portion 610 and a connecting portion 620.

The bonding portion 610 may be bonded to the cover part 500. Specifically, the bonding portion 610 may be bonded to the heating layer 530 and may be electrically connected to the heating layer 530 via the electrode layer 550. The bonding portion 610 may be formed, for example, in a ring shape.

The connecting portion 620 may be electrically connected at one end thereof to the bonding portion 610 and may be electrically connected at the opposite end thereof to the printed circuit board 410. The connecting portion 620 may be integrally formed with the bonding portion 610.

In order to electrically connect the heating layer 530 and the printed circuit board 410, which are spaced apart from each other in the optical-axis direction, the connecting portion 620 may be bent and extend from the bonding portion 610.

The connector 600 may be, for example, a flexible printed circuit board (FPCB). The connector 600 may include at least two leads, each of which may be connected to a corresponding one of the (+) terminal and the (−) terminal of the electrode layer 550.

Referring to FIG. 4a, the retainer 200 may include a protruding portion 210, which protrudes from the inner circumferential surface of the retainer 200 and supports the cover part 500. At least a portion of the connector 600, i.e. the bonding portion 610, may be disposed between the cover part 500 and the protruding portion 210.

Thus, the connecting portion 620 may be located in the space formed in the diametric direction between the inner surface of the retainer 200 and the barrel 100 inside the retainer 200. The bonding portion 610 may be electrically connected to the electrode layer 550.

An adhesive may be applied between the top surface of the protruding portion 210 and the bottom surface of the bonding portion 610 and between the top surface of the bonding portion 610 and the bottom surface of the cover part 500, thereby securely attaching the bonding portion 610 and the cover part 500 to the retainer 200.

The formation of the protruding portion 210 may increase the attachment area in which the cover part 500 is attached to the retainer 200. Since the attachment area is increased and a sufficient amount of adhesive is applied to the increased attachment area, it is possible to inhibit the formation of a gap in the attachment region between the cover part 500 and the retainer 200 and consequently to effectively inhibit the introduction of water or other foreign substances through the gap.

In addition, since the cover part 500 is securely attached to the retainer 200 due to the increase in the attachment area therebetween, it is possible to inhibit the cover part 500 from being separated from the retainer 200 by vibration or other external shocks.

Referring to FIGS. 2 and 5, the holder 300 may have therein a through-hole 310. The through-hole 310 may be formed in a direction parallel to the optical-axis direction. The through-hole 310, as illustrated in FIG. 5, may be formed such that the inner circumferential surface of the hollow region in the holder 300 is indented.

In order to electrically connect the heating layer 530 and the printed circuit board 410, the connecting portion 620 of the connector 600 may be disposed so as to penetrate the holder 300 in the optical-axis direction. Thus, the through-hole 310 may provide a space in which the connecting portion 620 penetrating the holder 300 is located.

Figure 6:
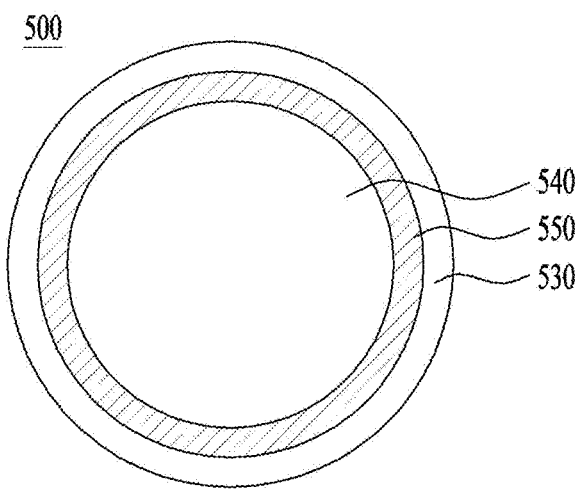
FIGS. 6 to 8 are views illustrating examples of an electrode layer.
Figure 7:
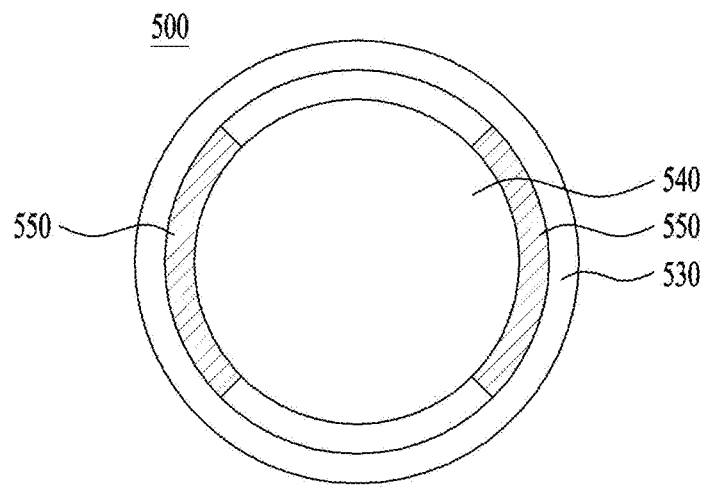
Figure 8:
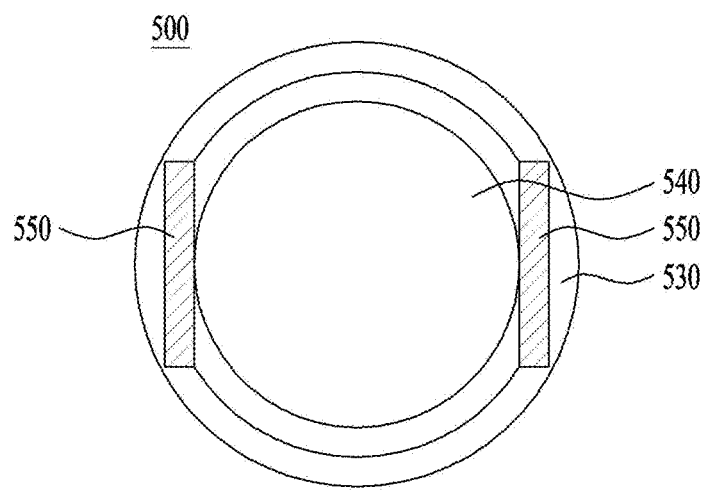

FIGS. 6 to 8 are views illustrating examples of the electrode layer 550. FIGS. 6 to 8 illustrate the state in which the electrode layer 550 is coupled to the cover part 500 when viewed from the lower side of the camera module to the upper side thereof in the optical-axis direction.

As illustrated in FIG. 6, the electrode layer 550 may be formed in a ring shape when viewed in the optical-axis direction. The electrode layer 550 may be made from, for example, an anisotropic conductive film material.

The anisotropic conductive film may have an overall film configuration, and may be formed by mixing conductive particles, such as gold (Au) or nickel (Ni) particles, with adhesive resin. Unlike an isotropic conductive film, the anisotropic conductive film may be configured to allow current to flow only in a specific direction.

In the embodiment, the anisotropic conductive film allows current to flow only in the optical-axis direction, but inhibits current from flowing, or allows only a very small amount of current to flow, in a planar direction perpendicular to the optical axis, i.e. in the circumferential direction of the ring-shaped electrode layer 550.

Thus, merely by connecting two leads of the connector 600, which need to be respectively connected to the (+) terminal and the (−) terminal in one embodiment, to the ring-shaped anisotropic conductive film at different positions thereof, current may smoothly flow to the heating layer 530 via the two leads without an electrical short, thereby heating the heating layer 530.

Thus, in the case in which the electrode layer 550 is formed in a ring shape using an anisotropic conductive film material, the two leads of the connector 600 may be connected to the electrode layer 550 without considering the polarity of the electrode layer 550, leading to simplification of the process.

In addition, in the case in which the electrode layer 550 is formed in a ring shape, compared to electrode layers 550 illustrated in FIGS. 7 and 8, the process of forming the electrode layer 550 may be facilitated, and the bonding force between the electrode layer 550 and the heating layer 530 and between the electrode layer 550 and the bonding portion 610 may be increased due to the large contact area between the electrode layer 550 and the heating layer 530 and between the electrode layer 550 and the bonding portion 610.

As illustrated in FIG. 7, when viewed in the optical-axis direction, the electrode layer 550 may be formed in a circular arc shape, and may be provided in a pair. The electrode layer 550 may be made from an anisotropic conductive film material, an isotropic conductive film material, a conductive resin material, or any one of other film-type conductive materials.

Here, the pair of electrode layers 550 may be arranged so as to avoid an electrical short. One of the electrode layers may serve as a (+) terminal, and the other one may serve as a (−) terminal. Thus, each of the two leads provided in the connector 600 may be electrically connected to a respective one of the pair of electrode layers 550.

The lengths of the circular arcs of the electrode layers 550 may be appropriately set in consideration of the entire structure of the camera module, processability of the electrode layers 550, etc. Of course, the pair of electrode layers 550 may have circular arcs having different lengths from each other.

As illustrated in FIG. 8, when viewed in the optical-axis direction, the electrode layer 550 may be formed in a straight line shape, and may be provided in a pair. The electrode layer 550 may be made from an anisotropic conductive film material, an isotropic conductive film material, a conductive resin material, or any one of other film-type conductive materials.

Similar to the example described with reference to FIG. 7, the pair of electrode layers 550 may be arranged so as to avoid an electrical short. One of the electrode layers may serve as a (+) terminal, and the other one may serve as a (−) terminal. Thus, each of the two leads provided in the connector 600 may be electrically connected to a respective one of the pair of electrode layers 550.

The length of the electrode layer 550 may be appropriately set within a range within which electrical connection to the heating layer 530 and the bonding portion 610 is possible. The pair of electrode layers 550 may have different lengths from each other.

Figure 9:
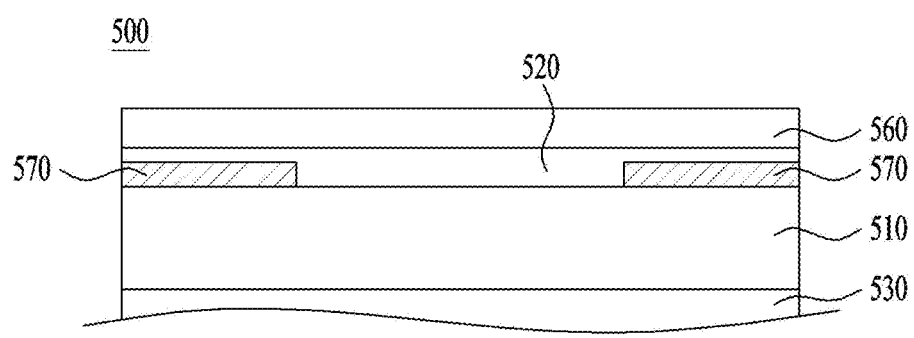
FIG. 9 is a view illustrating the structure of a cover part according to another embodiment. Components disposed under a heating layer in FIG. 9 may have the same structure as components disposed under a heating layer in FIG. 2.

FIG. 9 is a view illustrating the structure of a cover part 500 according to another embodiment. The components disposed under a heating layer 530 in FIG. 9 may have the same structure as the components disposed under the heating layer 530 in FIG. 2.

As illustrated in FIG. 9, the camera module according to the embodiment may include a coating layer 560 and a print layer 570.

The coating layer 560 may be disposed on the first reflection prevention layer 520, i.e. in the external exposed portion of the cover part 500, and may be coated with an ultra-hydrophilic material or a hydrophobic material. The coating layer may be formed in a circular shape when viewed in the optical-axis direction.

Condensation may form on the external exposed portion of the cover part 500 due to the influence of the surrounding environment. The condensation may lower the quality of an image captured by the camera module. Therefore, the coating layer 560 may serve to inhibit deterioration in the quality of an image attributable to condensation forming on the external exposed portion of the cover part 500.

In the case in which the coating layer 560 is coated with an ultra-hydrophilic material, the coating layer 560 may reduce the surface tension of the condensation, whereby the condensation may spread widely on the coating layer 560. The ultra-hydrophilic coating layer may inhibit an image captured by the image sensor 411 from being distorted or deteriorated in quality by condensation.

On the other hand, in the case in which the coating layer 560 is coated with a hydrophobic material, the coating layer 560 may increase the surface tension of the condensation, whereby the condensation may be easily removed from the cover part 500. Similar to the ultra-hydrophilic coating layer, the hydrophobic coating layer may inhibit an image captured by the image sensor 411 from being distorted or deteriorated in quality by condensation.

The print layer 570 may be disposed between the cover glass 510 and the first reflection prevention layer 520 and may be formed in a ring shape along the periphery of the first reflection prevention layer 520. The print layer may be made from an opaque material.

The print layer 570 may overlap the electrode layer 550 when viewed in the optical-axis direction, and may be wide enough to shield the entire region of the electrode layer 550. The print layer 570 shielding the electrode layer 550 may make the interior of the camera module invisible when observed from the outside, thereby providing a neat external appearance and thus improving the aesthetic design of the camera module.

In addition, the print layer 570 may inhibit external incident light from directly reaching the electrode layer 550 and being reflected therefrom, thereby inhibiting the quality of an image captured by the image sensor 411 from being deteriorated by the optical reflection from the electrode layer 550.

In the camera module according to the embodiment, the cover part 500 is heated by a simple structure using the heating layer 530, thus making it possible to inhibit the formation of dew or frost or to promptly remove dew or frost that has already formed.

Although only a limited number of embodiments have been described above, various other embodiments are possible. The technical contents of the above-described embodiments may be combined into various forms as long as they are not incompatible with one another, and thus may be implemented in new embodiments.

INDUSTRIAL APPLICABILITY

In the camera module according to the embodiment, a cover part is heated by a simple structure using a heating layer, thus making it possible to inhibit the formation of dew or frost or to promptly remove dew or frost that has already formed.

The invention claimed is:

1. A camera module comprising:
   a retainer;
   a lens barrel disposed in the retainer;
   a housing disposed under the retainer;
   a circuit board disposed in the housing;
   a cover part mounted on a top portion of the retainer; and
   a connector disposed under the cover part,
   wherein the cover part comprises:
   a cover glass;
   a heating layer disposed under the cover glass; and
   an electrode layer disposed under the heating layer,
   wherein the connector electrically connects the heating layer and the circuit board.

2. The camera module according to claim 1, comprising a holder disposed between the retainer and the housing, wherein the holder is coupled to the retainer and the housing.

3. The camera module according to claim 1, wherein the cover part comprises:
   a first reflection prevention layer disposed on an upper surface of the cover glass; and
   a second reflection prevention layer disposed on under the heating layer.

4. The camera module according to claim 3, wherein the electrode layer and the second reflection prevention layer are disposed on a lower surface of the heating layer.

5. The camera module according to claim 4, wherein the electrode layer is in contact with a side surface of the second reflection prevention layer.

6. The camera module according to claim 1, wherein the connector comprises:
   a bonding portion disposed under the electrode layer and bonded to the electrode and layer; and
   a connecting portion electrically connecting the bonding portion and the circuit board.

7. The camera module according to claim 6, wherein one end of the connecting portion is connected to the bonding portion and another end of the connecting portion is connected to the circuit board.

8. The camera module according to claim 6, wherein the connecting portion is bent and extends from the bonding portion.

9. The camera module according to claim 6, wherein the electrode layer is formed in a ring shape when viewed in an optical-axis direction.

10. The camera module according to claim 6, wherein the electrode layer is formed in a circular arc shape or a straight line shape when viewed in an optical-axis direction and is provided in a pair.

11. The camera module according to claim 1, wherein the electrode layer is made from an anisotropic conductive film (ACF) material.

12. The camera module according to claim 1, wherein the heating layer is configured to heat the cover glass.

13. The camera module according to claim 1, wherein the cover part comprises a coating layer disposed on the first reflection prevention layer, the coating layer being coated with an ultra-hydrophilic material or a hydrophobic material.

14. The camera module according to claim 9, wherein the bonding portion is formed in a ring shape.

15. The camera module according to claim 6, wherein the retainer comprises a protruding portion protruding from an inner circumferential surface thereof, the protruding portion being configured to support the cover part, and
   wherein the bonding portion is disposed between the cover part and the protruding portion.

16. The camera module according to claim 6, wherein the connecting portion is located in a space between an inner surface of the retainer and the lens barrel inside the retainer.

17. The camera module according to claim 1, comprising an image sensor disposed on the circuit board.

18. The camera module according to claim 1, wherein an indented portion is formed in a top portion of the retainer, and the cover part is disposed in the indented portion of the retainer.

19. A camera module comprising:
   a retainer;
   a lens barrel disposed in the retainer;
   a housing disposed under the retainer;
   a holder disposed between the retainer and the housing and coupled to the retainer and the housing;
   a circuit board disposed in the housing;
   a cover part mounted on a top portion of the retainer; and
   a connector disposed under the cover part,
   wherein the cover part comprises:
   a cover glass;
   a heating layer disposed on a lower surface of the cover glass; and
   an electrode layer disposed on a lower surface of the heating layer,
   wherein the connector comprises a bonding portion coupled to the electrode layer and a connecting portion connecting the bonding portion and the circuit board, and
   wherein the connecting portion is located in a space between an inner surface of the retainer and the lens barrel inside the retainer and between an inner surface of the holder and the lens barrel.

20. A camera module comprising:
   a retainer;
   a lens barrel disposed in the retainer;
   a holder coupled to a lower portion of the retainer;
   a housing disposed under the holder;
   a circuit board disposed in the housing;
   a cover part mounted on a top portion of the retainer; and
   a connector disposed under the cover part,
   wherein the cover part comprises:
   a cover glass;
   a heating layer disposed under the cover glass;
   an electrode layer disposed under the heating layer;
   an opaque layer disposed between the cover glass and the reflection prevention layer,
   wherein the opaque layer overlaps the electrode layer in an optical-axis direction, and
   wherein one end of the connector is connected to the electrode layer and another end of the connector is connected to the circuit board.

* * * * *